(12) United States Patent
Ozawa

(10) Patent No.: US 8,188,429 B2
(45) Date of Patent: May 29, 2012

(54) SCANNING ELECTRON MICROSCOPE FOR DETERMINING QUALITY OF A SEMICONDUCTOR PATTERN

(75) Inventor: Yasuhiko Ozawa, Abiko (JP)

(73) Assignee: Hitachi High-Technologies Corporation, Tokyo (JP)

( * ) Notice: Subject to any disclaimer, the term of this patent is extended or adjusted under 35 U.S.C. 154(b) by 460 days.

(21) Appl. No.: 12/184,657

(22) Filed: Aug. 1, 2008

(65) Prior Publication Data
US 2009/0032710 A1 Feb. 5, 2009

(30) Foreign Application Priority Data

Aug. 3, 2007 (JP) ................................ 2007-202458

(51) Int. Cl.
*H01J 37/28* (2006.01)
(52) U.S. Cl. ........ 250/311; 250/306; 250/307; 382/276; 382/278
(58) Field of Classification Search .................. 250/306, 250/307, 309, 310, 311; 382/276, 278
See application file for complete search history.

(56) References Cited

U.S. PATENT DOCUMENTS

| | | | |
|---|---|---|---|
| 6,107,637 A | | 8/2000 | Watanabe et al. |
| 6,448,555 B1 * | | 9/2002 | Hosokawa .......................... 850/9 |
| 2003/0015659 A1 * | | 1/2003 | Honda et al. ................... 250/306 |
| 2004/0156223 A1 | | 8/2004 | Tanaka et al. |
| 2005/0173633 A1 | | 8/2005 | Tanaka et al. |
| 2005/0244049 A1 * | | 11/2005 | Onishi et al. ................... 382/141 |
| 2006/0215901 A1 * | | 9/2006 | Nakagaki et al. .............. 382/149 |
| 2007/0085007 A1 * | | 4/2007 | Araki et al. ................... 250/310 |
| 2007/0198955 A1 * | | 8/2007 | Nagatomo et al. ................. 716/1 |
| 2007/0222464 A1 * | | 9/2007 | Honda et al. ................... 324/751 |

FOREIGN PATENT DOCUMENTS

| | | |
|---|---|---|
| JP | 02-247964 | 10/1990 |
| JP | 11-149895 | 6/1999 |
| JP | 2001-023562 | 1/2001 |
| JP | 2004-247394 | 9/2004 |
| JP | 2005-189137 | 7/2005 |
| JP | 2006-269489 | 10/2006 |

OTHER PUBLICATIONS

Japanese Office Action issued in Japanese Patent Application No. JP 2007-202458 dated Dec. 1, 2009; w/ English the correspondence chart for the cited US publications.

* cited by examiner

*Primary Examiner* — David A Vanore
*Assistant Examiner* — Nicole Ippolito
(74) *Attorney, Agent, or Firm* — McDermott Will & Emery LLP

(57) ABSTRACT

Disclosed herein is a scanning electron microscope capable of determining quality of a semiconductor pattern, deformation of contact-holes, and inclination of the sidewall of the contact-holes, respectively. To that end, the scanning electron microscope includes image pickup means for picking up images of a circuit pattern formed on a semiconductor wafer on a preset condition, calculation means for comparing each of the images picked up by the image pickup means with a prestored reference image to thereby calculate a feature of the images picked up, and a computer for executing evaluation on quality of the circuit pattern on the basis of the feature calculated by the calculation means, and calculation of the feature is executed independently with reference to a secondary electron image, and each of back-scattering electron images.

7 Claims, 5 Drawing Sheets

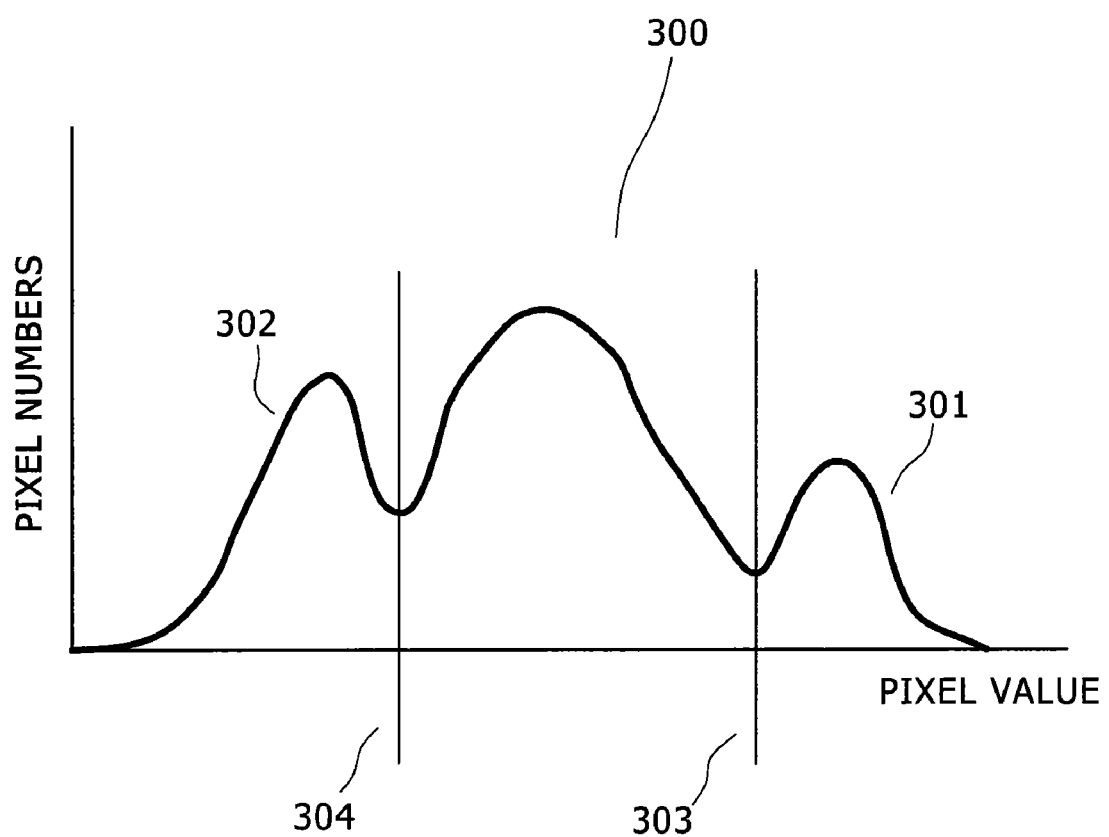

SCANNING ELECTRON MICROSCOPE FOR DETERMINING QUALITY OF A SEMICONDUCTOR PATTERN

FIELD OF THE INVENTION

The invention relates to a scanning electron microscope provided with means for automatically picking up images of a circuit pattern formed on a semiconductor wafer on a preset condition, and digitizing quality of a semiconductor pattern by use of the images as picked up, and a reference image to thereby calculate the same.

BACKGROUND OF THE INVENTION

It is necessary to inspect a pattern on a semiconductor wafer, formed in a semiconductor manufacturing process, to find out whether or not the pattern is formed as designed. Accordingly, there has since been developed a critical dimension SEM that is a scanning electron microscope with addition of a function for measuring dimensions of a pattern, thereby calculating features such as a pattern width, respective diameters of contact holes, roughness, and so forth, on the basis of image signals (refer to, for example, JP-A-2004-247394, and US2004/0156223A). Further, there have been practiced not only observation of an image, by use of the scanning electron microscope, but also automatic pickup, and classification of the image having various defects such as a pattern open, a pattern bridge, scratch, particle, and so forth, by use of a review SEM with addition of a function for determining the features of the image with the use of a computer. Still further, there has also been practiced fixed-point observation of critical parts of a semiconductor pattern, by use of the review SEM, to thereby display an image as picked up, and execute quantification of the quality of the pattern by calculating the features of the image. Furthermore, as progress is made in the miniaturization of the pattern, it has since been required to speedily, accurately, and simply calculate a quantitative value of the quality, including a three-dimensional shape such as the sidewall of the pattern, and the sidewall of each of the contact holes.

However, with a conventional technology, since the features of an image are calculated by use of only an image formed by secondary electrons ejected from a direction vertical to a wafer, it has been difficult to turn three-dimensional information such as the sidewall of the pattern, and the sidewall of each of the contact holes into an image, and even if imaging thereof is possible, it has been impossible to find the quantitative value of the quality.

SUMMARY OF THE INVENTION

It is therefore an object of the invention to provide a scanning electron microscope capable of determining quality of a semiconductor pattern, deformation of contact-holes, and inclination of the sidewall of the contact-holes, respectively.

To that end, the invention provides in its one aspect a scanning electron microscope including image pickup means for picking up images of a circuit pattern formed on a semiconductor wafer on a preset condition, calculation means for comparing each of the images picked up by the image pickup means with a prestored reference image to thereby calculate a feature of the images picked up, and a computer for executing evaluation on quality of the circuit pattern on the basis of the feature calculated by the calculation means, wherein calculation of the feature is executed independently with reference to a secondary electron image, and each of back-scattering electron images.

Thus, with the invention, it is possible to obtain the scanning electron microscope capable of accurately and easily determining quality of the semiconductor pattern, deformation of contact-holes, and inclination of the sidewall of the contact-holes, respectively.

BRIEF DESCRIPTION OF THE DRAWINGS

FIG. 3 is a histogram of an image, showing a relationship of pixel value vs. pixel numbers;

DETAILED DESCRIPTION OF THE PREFERRED EMBODIMENTS

Figure 1:
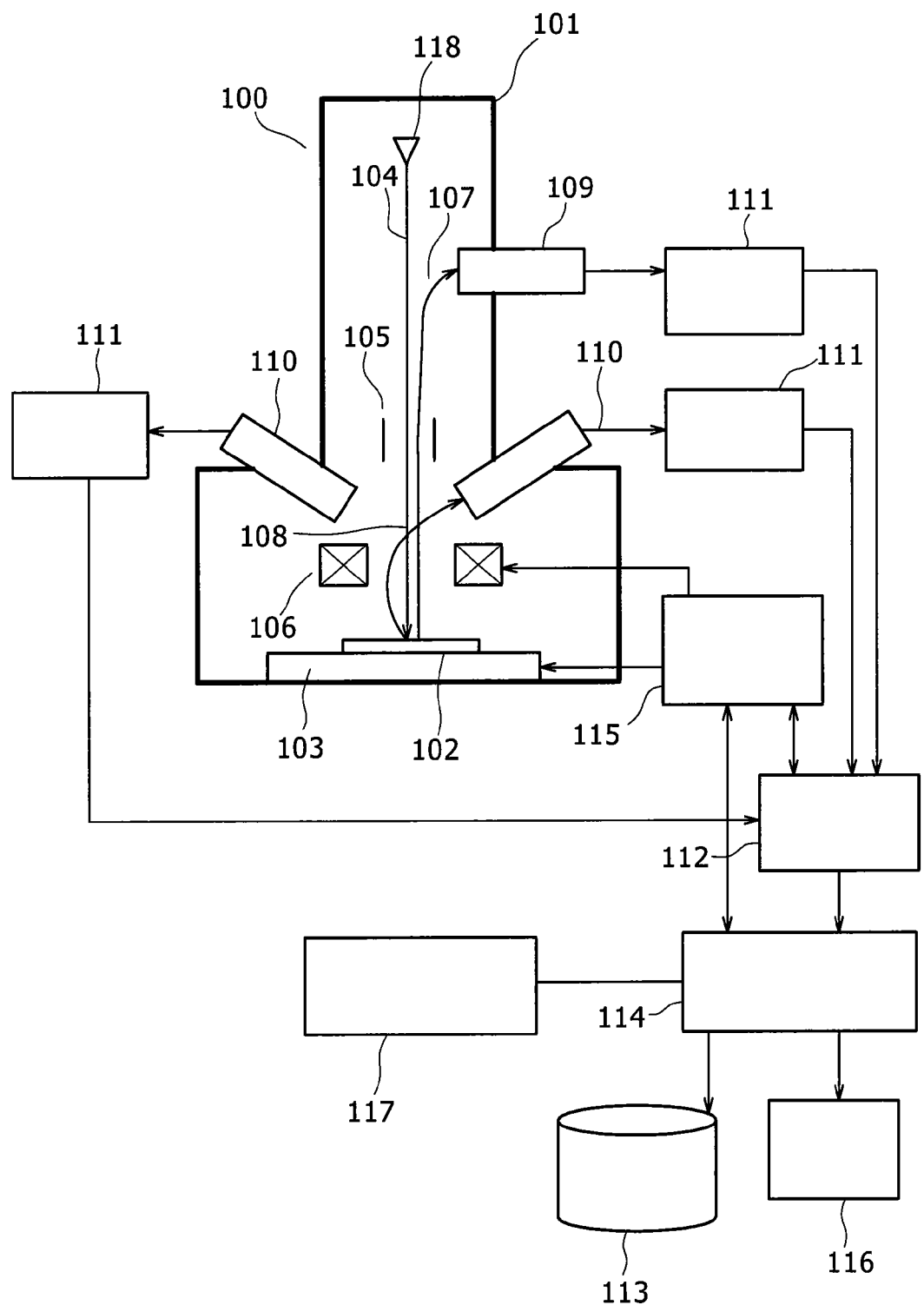
FIG. 1 is a vertical sectional view broadly showing a configuration of a scanning electron microscope.

An embodiment of a scanning electron microscope according to the invention is described hereinafter with reference to the accompanying drawings. FIG. 1 is a vertical sectional view broadly showing a configuration of the scanning electron microscope. The scanning electron microscope 100 includes an enclosure 101 containing a table 103 for transferring a wafer 102. An electron beam 104 irradiated from an electron beam source 118 is two-dimensionally scanned over the wafer 102 by a deflector 105. The focusing of the electron beam 104 is adjusted by an electron lens 106.

By scanning over the wafer, with the electron beam, secondary electrons 107, and back-scattering electrons 108 are ejected from the wafer. Those secondary electrons 107, and back-scattering electrons 108, as ejected, are detected by detectors 109, 110, respectively, to be converted into electrical signals, and analog signals are further converted into digital signals, respectively, by A/D converters 111, thereby enabling a two-dimensional gray scale image to be obtained. The image as obtained is delivered as image signals to a processor 112 where processing, such as calculation of features of the image, is executed. Results of the processing are shown on a display 116 of a computer 114, and are transmitted as necessary to a memory such as a hard disk 113, or to a computer 117 of another system via a network. Overall control is executed by the computer 114, and control of operations of a system is executed by a computer 115 for control. An image formed on the basis of the secondary electrons 107 is referred to as an SE image, and an image formed on the basis of the back-scattering electrons 108 is referred to as a BSE image.

Figure 2:
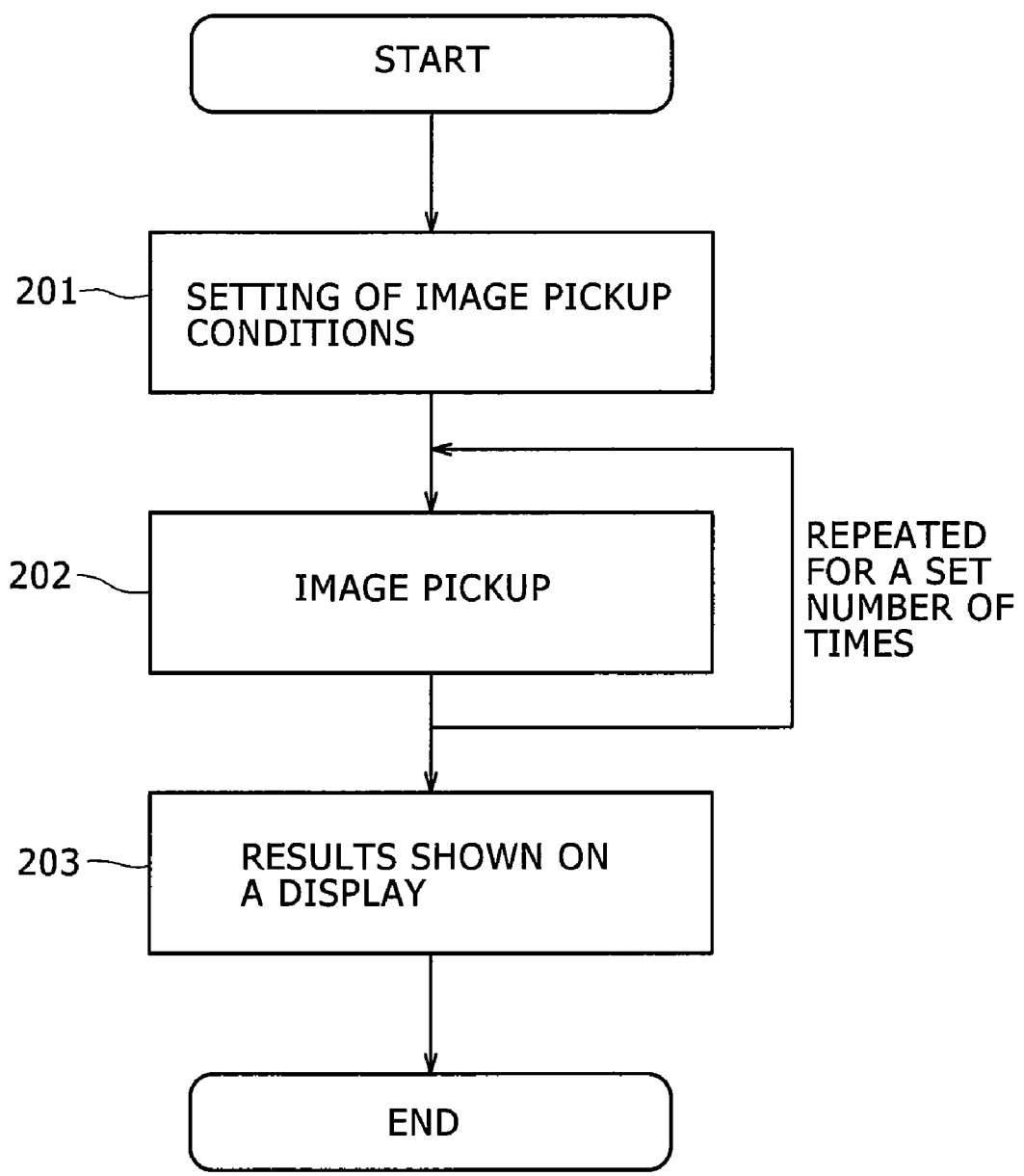
FIG. 2 is a flowchart showing a basic flow of operational steps according to the invention.

FIG. 2 is a flowchart showing a basic flow of operational steps according to the invention. The operational steps are pre-stored in the hard disk 113, and are executed by the computer 114. First, there are set conditions on which an image of a circuit pattern formed on a semiconductor wafer is automatically picked up (step 201). The conditions set at this point in time include an addressing image for transferring a field of view to a pattern image to be picked up, an acceleration voltage and a probe current of the electron microscope, size of the field of view for a picked-up image, the number of summed up sheets of images, an auto-focusing condition, and so forth. Further, if the number of images to be picked up is plural, chip numbers and chip positions, for identifying respective locations of the images are designated. Furthermore, a reference image is designated in order to calculate features of images.

Next, images at a desired location are picked up on the conditions described above (step 202). Picked up images are two sheets of the BSE images, acquired from two units of the detectors 110 opposing each other, respectively, besides the SE image. The SE image is normally an image acquired when the wafer is observed from the direction vertical thereto, and each of the BSE images is a shaded image that is acquired when the wafer is irradiated with light from a direction slanting thereto, and is observed from the direction vertical thereto.

Subsequently, by making use of three sheets of the images picked up as above, the features of the pattern are calculated. For calculation of the features, use is made of a normalized correlation value R against the reference image.

$$R = \frac{\sum (f_{ij}) \times (g_{ij})}{\sqrt{\sum (f_{ij})^2 \times (g_{ij})^2}}$$ Expression (1)

where $f_{ij}$: reference image, $g_{ij}$: picked-up image Herein, since the three sheets of the images are used, three pieces of the normalized correlation values can be obtained. Those normalized correlation values are designated $R_{SE}$, $R_L$, and $R_R$, respectively. Those normalized correlation values R each represents similarity between the reference image f, and the picked-up image g, serving as an index for quantification of the quality of the pattern. Because only the SE image has been in use for expression of the similarity in the past, only two-dimensional information has been directly obtainable, so that it has been impossible to quantify the quality including the three-dimensional shape such as the sidewall of the pattern.

With the invention, since the shape of the sidewall of the pattern can be portrayed as information on the shaded image with the use of the BSE images, the three-dimensional shape of the pattern can be quantified according to the feature referred to as the similarity by calculating the normalized correlation values of $R_L$, and $R_R$ of the BSE images, respectively, thereby enabling a three-dimensional quality to be evaluated.

Finally, the feature R calculated above, picked-up images, information with the picked-up images attached thereto, and so forth are shown in the display 116 (step 203). Further, those results are transmitted as necessary to the memory such as the hard disk 113, and to the computer 117 of another system via the network. Further, there can be the case where use is made of a composite image made up of the SE image and the BSE images depending on the features as calculated.

$$f_R' = \alpha f_{SE} + \beta f_R$$

$$f_L' = \alpha f_{SE} + \beta f_L$$ Expression (2)

where α, β each are a constant

If, for example, the expression (2) holds, the feature can be calculated on the basis of an image acquired by adding information on a shaded image from the left side or the right side to information on the shape as observed from the vertical direction, thereby enabling quality including the three-dimensional shape of the pattern to be quantified.

Further, the preceding expression may be as follows:

$$f_R' = \alpha f_R + \beta f_L$$

$$f_L' = \alpha f_L + \beta f_R$$ Expression (3)

where α, β each are a constant

According to the expression described as above, it is possible to calculate the feature on the basis of an image with emphasis on either the left-side shaded image, or the right-side shaded image, so that quality with more emphasis on the three-dimensional information concerning the sidewall of the pattern can be quantified.

Further, image synthesis is also possible as follows:

$$f' = \alpha f_{SE} + \beta f_R + \gamma f_L$$ Expression (4)

where α, β, and γ each are a constant

According to the expression described above, it follows that one sheet of an image includes information on both the left-side and the right-side shaded images, so that it is possible to quantify the quality of the pattern, according to a three-dimensional shape thereof.

Only the highlighted part, and shadow part are extracted through threshold-value processing from the image acquired from the expression (3), and subsequently, the feature can also be calculated by use of those extracted images. In order to do so, against the image $f_R = \alpha f_R + \beta f_L$ as acquired from the expression (3), there is first decided a threshold value at which only the highlight part or shadow part can be extracted.

FIG. 3 is a histogram of an image, showing a relationship of pixel value vs. pixel numbers. Normally, the histogram 300 of the image, as shown in FIG. 3, is worked out, thereby deciding threshold values 303, or 304, respectively, at which either a highlight part 301 larger in pixel value or a shadow part 302 smaller in pixel value can be separated. If the pixel numbers have three peaks, as in the case of an example shown in FIG. 3, it will suffice to provide the threshold values at two valleys, respectively. Because the threshold values as decided herein are normally applicable to other images as well, if the threshold values are preset as image pickup conditions, it becomes unnecessary for an operator to set the threshold values on an image-by-image basis. If the threshold values are dependent on a wafer and the image pickup conditions, the threshold values are kept registered in recipes corresponding thereto, respectively. If a plurality of the threshold values are kept registered, it is possible to make selection therefrom as appropriate.

Figure 4A:
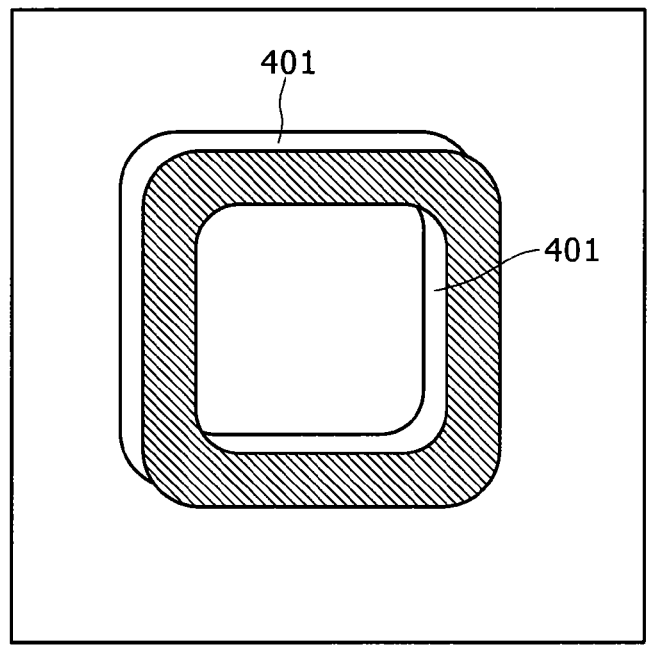
FIGS. 4(a) and 4(b) each are a screen view showing an example of an image displayed on a screen of the scanning electron microscope.
Figure 4B:
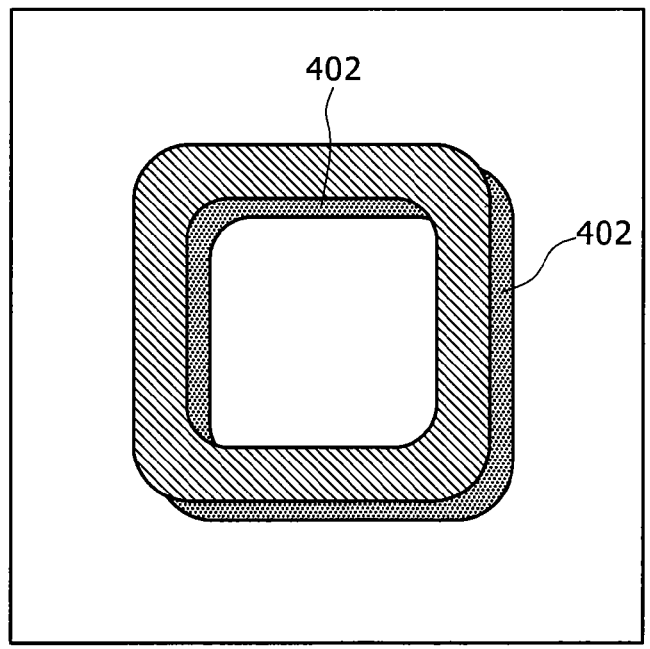

FIGS. 4(a) and 4(b) each are a screen view showing an example of an image displayed on a screen of the scanning electron microscope, in which FIG. 4(a) displays a highlight part 401 separated at the threshold value 303 shown in FIG. 3, and FIG. 4(b) displays a shadow part 402 separated at the threshold value 304 shown in FIG. 3. Thus, if the histogram shown in FIG. 3 is separated into parts at the respective threshold values, the highlight part 401 and the shadow part 402 of the image, in as-separated state, will be displayed, thereby enabling the quality of a three-dimensional image to be quantified with ease.

As an image for use in calculation of the feature, use can be made of only a designated range of a picked-up image instead of using the picked-up image in whole.

Figure 5:
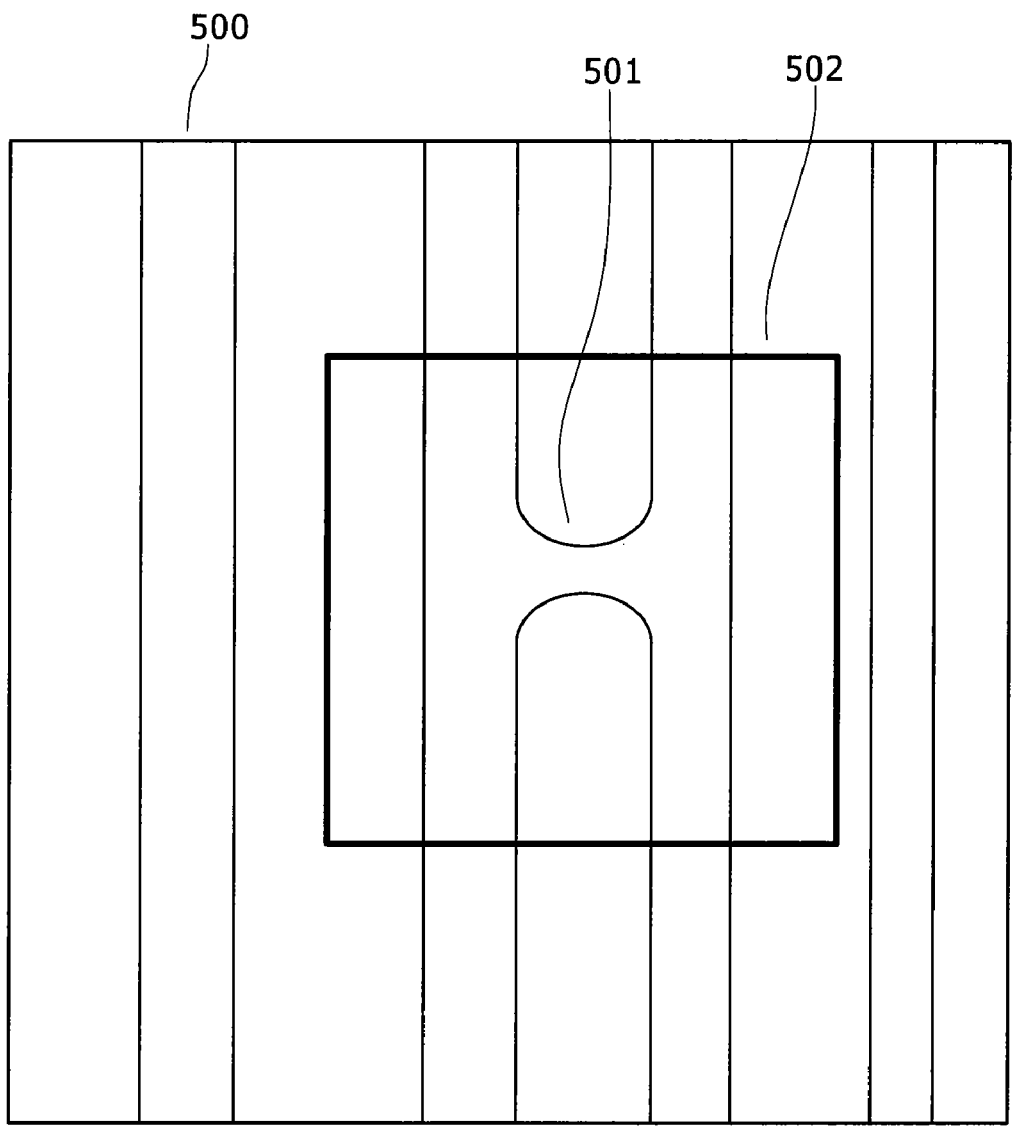
FIG. 5 is a screen view showing an example of an image of a pattern, displayed by the scanning electron microscope.

FIG. 5 is a screen view showing an example of an image of a pattern, displayed by the scanning electron microscope, in which a line-space pattern is displayed within an image 500. When the quality of the pattern is evaluated with attention being focused on a defective spot 501 of the pattern, it is unnecessary to evaluate quality of a region surrounding the defective spot 501. Accordingly, a program is preset in the hard disk 113 such that the quality of the interior of only a region 502 for evaluating quality, designated on the screen, is quantified by the computer 114.

The region 502 may be manually set on the image-by-image basis by the operator, however, when the same defect as is found in the defective spot 501 is to be detected from a plurality of images with attention being focused on occurrence of the defective spot 501, an image of the region 502 is kept registered as a template in the hard disk 113, and use of the template as a feature calculation area at the time of setting the image pickup conditions is designated, causing the computer 114 to automatically detect the area out of a picked-up image by template matching processing to thereby calculate the feature. For example, if the sidewall of the pattern, obtained from an image acquired by tilting an electron beam, is designated as the region 502, this will eliminate the need for designating the sidewall every time an image is acquired, thereby enabling evaluation on the quality of the sidewall to be implemented with ease.

As described in the foregoing, with the use of the image formed on the basis of the back-scattering electrons obtained from the oppositely disposed detectors, in addition to the image formed by the secondary electrons from the direction vertical to the wafer, information on the sidewall of a pattern can be visualized as a shaded image; and the feature is calculated as a quantitative value from the information on the sidewall, thereby enabling the three-dimensional quality of a semiconductor pattern to be quantified.

FIG. 2
201: setting of image pickup conditions
202: image pickup (repeated for a set number of times)
203: results shown on a display
画素数: pixel numbers
画素値: pixel value

What is claimed is:

1. A scanning electron microscope comprising:
    image pickup means for picking up shaded images and a secondary electron image of a circuit pattern formed on a semiconductor wafer based on a preset condition;
    calculation means that calculates a feature of the shaded images by calculating a normalized correlation value of the shaded images against a prestored reference image; and
    a computer for evaluating quality of the circuit pattern on the basis of the feature calculated by using the normalized correlation value, wherein:
    each of the shaded images is an image acquired on the basis of a signal detected by each of a plurality of oppositely opposed detectors provided in the image pickup means, and
    the calculation means independently calculates the feature of each of the shaded images obtained from the oppositely disposed detectors by calculating, for each shaded image, a first normalized correlation value from one of the oppositely disposed detectors and a second normalized correlation value from a second one of the oppositely disposed detectors.

2. The scanning electron microscope according to claim 1 comprising:
    said calculation means extracts a highlighted part where pixel value is larger than a pre-determined threshold or a shadow part where pixel value is smaller than a pre-determined threshold from each shaded image; and
    a computer thr evaluating quality of a shape of the circuit pattern on the basis of the feature obtained from the highlighted part or the shadow part.

3. The scanning electron microscope according to claim 2, wherein an image for the calculation of the feature is a combined image from two kinds of shaded images.

4. The scanning electron microscope according to claim 2, wherein calculation of the feature is executed by use of an image acquired by tilting an electron beam.

5. The scanning electron microscope according to claim 1, wherein an image for the calculation of the feature is a combined image obtained from the secondary electron image and the shaded images.

6. The scanning electron microscope according to claim 1, wherein an image for use in calculation of the feature is an image acquired by extracting information only on the sidewall of a semiconductor pattern from an image found by operation on the basis of two kinds of back-scattering electron images concurrently found.

7. The scanning electron microscope according to claim 2, wherein calculation of the feature is executed with reference to a pre-designated region only.

* * * * *